United States Patent
Kim

(10) Patent No.: US 7,038,968 B2
(45) Date of Patent: May 2, 2006

(54) SELF-REFRESH CONTROL CIRCUIT

(75) Inventor: You Sung Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 96 days.

(21) Appl. No.: 10/876,780

(22) Filed: Jun. 28, 2004

(65) Prior Publication Data

US 2005/0228611 A1    Oct. 13, 2005

(30) Foreign Application Priority Data

Apr. 13, 2004    (KR) ...................... 10-2004-0025475

(51) Int. Cl.
*G11C 7/00*    (2006.01)

(52) U.S. Cl. ..................... 365/222; 365/211

(58) Field of Classification Search ................ 365/222, 365/211

See application file for complete search history.

(56) References Cited

U.S. PATENT DOCUMENTS

| | | | | |
|---|---|---|---|---|
| 5,710,911 A | * | 1/1998 | Walsh et al. ................. | 713/500 |
| 5,822,550 A | * | 10/1998 | Milhaupt et al. ............ | 710/315 |
| 5,867,717 A | * | 2/1999 | Milhaupt et al. ............ | 713/323 |
| 6,721,223 B1 | * | 4/2004 | Matsumoto et al. ........ | 365/222 |

* cited by examiner

*Primary Examiner*—Michael Tran
(74) *Attorney, Agent, or Firm*—Heller Ehrman LLP

(57) ABSTRACT

A self-refresh control circuit can be simplified by using a division value generated from an Extended Mode Register Set (EMRS) at low temperature without a limiter used in a Temperature Compensated Self Refresh (TCSR). The self-refresh control circuit comprises an EMRS TCSR basic cycle generating unit, a temperature sensor, a division setting unit and a self-refresh operating cycle generating unit. The EMRS TCSR basic cycle generating unit generates an EMRS TCSR basic cycle using a division value of an EMRS code. The temperature sensor generates a detecting signal depending on temperature monitored in a chip. The division setting unit generates a reference cycle by multiplying the EMRS TCSR basic cycle by a division value of the EMRS code selected in response to a selecting signal or by a division value corresponding to the detecting signal. The self-refresh operating cycle generating unit generates a self-refresh operating cycle with the reference cycle.

5 Claims, 4 Drawing Sheets

SELF-REFRESH CONTROL CIRCUIT

BACKGROUND OF THE INVENTION

1. Field of the Invention

The present invention generally relates to a self-refresh control circuit, and more specifically, to a self-refresh control circuit simplified with a division value generated in an Extended Mode Register Set (hereinafter, referred to as "EMRS") without a limiter used in a Temperature Compensated Self Refresh (hereinafter, referred to as "TCSR").

2. Description of the Prior Art

Generally, a self-refresh operation refers to a self-operation performed with a predetermined cycle, that is, a basic cycle, in a volatile memory device such as DRAM in order to maintain data stored in a memory cell at a standby state.

It is important to reduce self-refresh current at the standby state in the DRAM used for a portable device.

Methods for reducing the self-refresh current includes a Partial Array Self Refresh (hereinafter, referred to as "PASR"), Temperature Compensated Self Refresh (hereinafter, referred to as "TCSR") and a Deep Power Down Mode (hereinafter, referred to as "DPD"). Here, the PASR and the TCSR are programmed by a user.

In the conventional programmed TCSR, a self-refresh cycle is changed depending on a temperature set by a user. Since data retention time of the device at low temperature more increases than at high temperature, the self-refresh cycle is set to be longer when the DRAM is used at low temperature, thereby reducing power consumption.

However, programmed EMRS-TCSR is a limited method because the operation of the DRAM cannot be secured when the usage temperature of actual product is over the programmed temperature range.

In order to improve the above-described problem, an auto-TCSR is used. The auto-TCSR is to automatically regulate a refresh cycle depending on temperature not by setting temperature by a user but by monitoring temperature in a chip. Specifically, the auto-TCSR having a temperature sensor in the memory chip is an on-die TCSR.

In the on-die TCSR, current flowing in a diode is changed depending on temperature. Here, the refresh cycle is set to be long as current flowing in a diode becomes small at low temperature. Since the change quantity of the refresh cycle depending on temperature is larger in the conventional circuit than in the EMRS, the refresh cycle becomes longer than the refresh limit of the actual device at low temperature, which results in operating errors. Therefore, a limiter is required to prevent the refresh cycle from being longer than a predetermined cycle at low temperature.

In case of the conventional on-die TCSR, a basic cycle which decreases with increase of temperature is generated, a final self-refresh cycle is set after division is selected in consideration of distribution of the chip.

However, since the distribution of the basic cycle is dispersive, a selected division value is differentiated.

Furthermore, the circuit is complicated because the limiter is used to prevent generation of bit fail due to long basic cycle at low temperature so that the basic cycle may not be longer than a predetermined cycle.

SUMMARY OF THE INVENTION

It is an object of the present invention to simplify a circuit by setting self-refresh operating cycle obtained by multiplying division of a temperature sensor by an EMRS TCSR basic cycle without an on-die TCSR function.

It is another object of the present invention to simplify a circuit with division of an EMRS code as a limiter without a cycle limiter.

In an embodiment, a self-refresh control circuit comprises an EMRS TCSR basic cycle generating unit, a temperature sensor, a division setting unit and a self-refresh operating cycle generating unit. The EMRS TCSR basic cycle generating unit generates an EMRS TCSR basic cycle using a division value of an EMRS code. The temperature sensor generates a detecting signal depending on temperature monitored in a chip. The division setting unit generates a reference cycle by multiplying the EMRS TCSR basic cycle by a division value of the EMRS code selected in response to a selecting signal or by a division value corresponding to the detecting signal. The self-refresh operating cycle generating unit generates a self-refresh operating cycle with the reference cycle.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
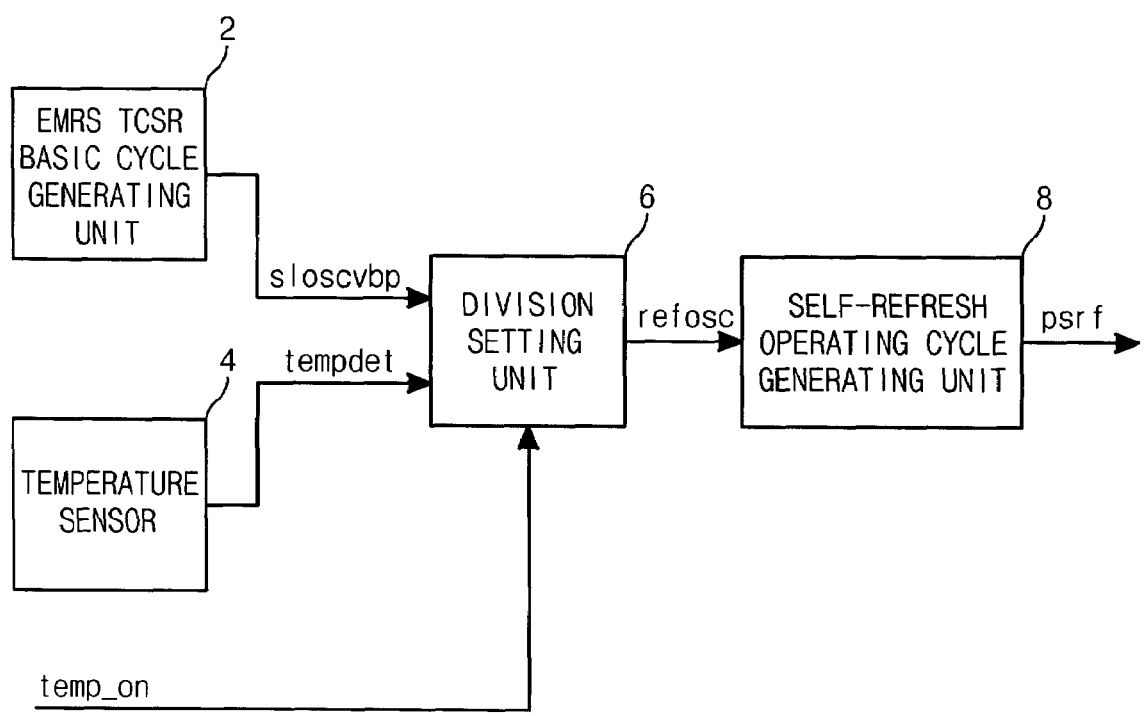
FIG. 1 is a block diagram illustrating a self-refresh control circuit according to an embodiment of the present invention.

FIG. 1 is a block diagram illustrating a self-refresh control circuit according to an embodiment of the present invention.

In an embodiment, a self-refresh control circuit comprises an EMRS TCSR basic cycle generating unit 2, a temperature sensor 4, a division setting unit 6 and a self-refresh operating cycle generating unit 8.

The EMRS TCSR basic cycle generating unit 2 generates a basic cycle sloscvbp depending on a division value of the EMRS code.

The temperature sensor 4 monitors the temperature in a chip to generate a detecting signal tempdet.

The division setting unit 6 generates a reference cycle refosc by multiplying the basic cycle sloscvbp generated from the EMRS TCSR basic cycle generating unit 2 by a division value of the EMRS code selected by a selecting signal temp_on or a division value corresponding to the detecting signal tempdet from the temperature sensor 4. Here, the selecting signal temp_on is to select a basic cycle of the existing EMRS or the on-die TCSR division generator.

The self-refresh operating cycle generating unit 8 generates a self-refresh operating cycle psrf depending on the reference cycle refosc generated by the division value set by the division setting unit 6.

Figure 2A:
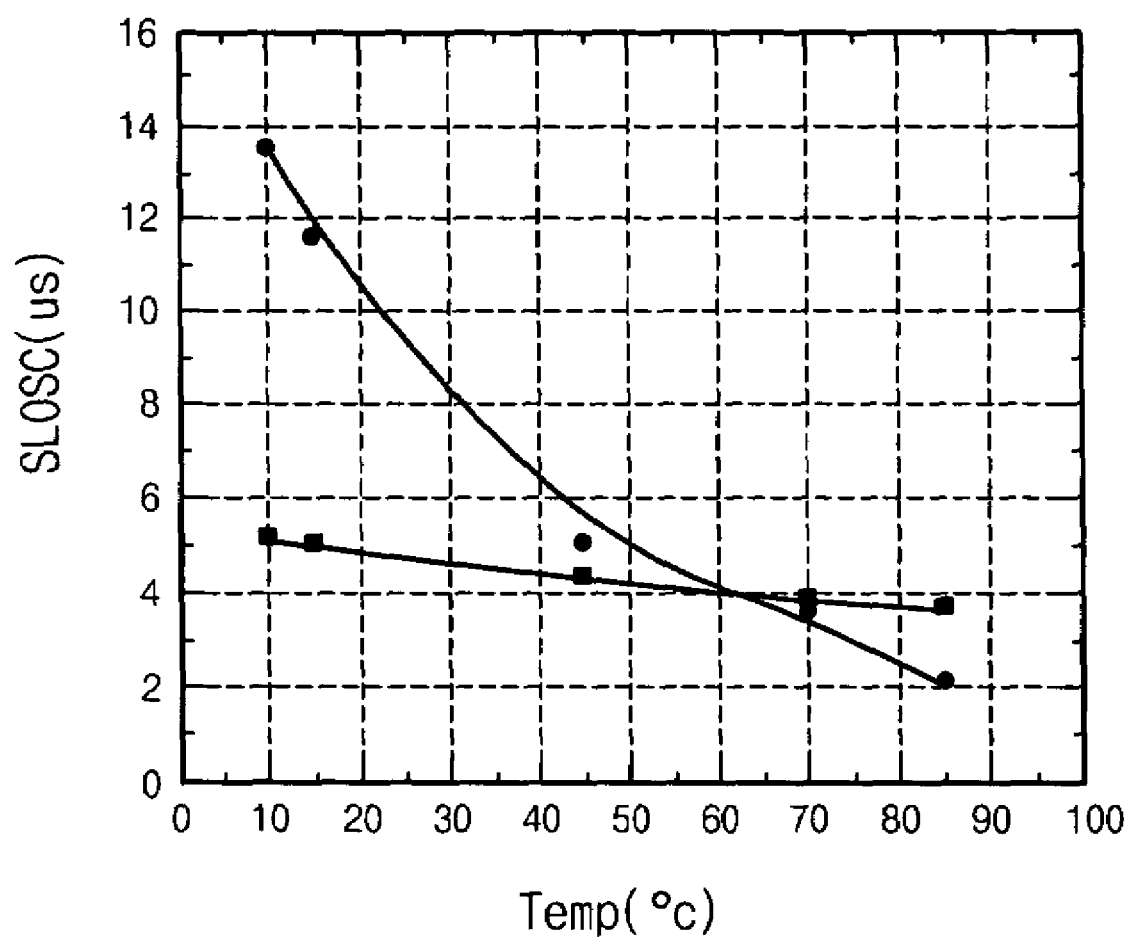
FIG. 2A is a graph illustrating a basic cycle of an EMRS TCSR and a basic cycle of an on-die TCSR.

FIG. 2A is a graph illustrating temperature characteristics of the EMRS TCSR basic cycle sloscvbp and the on-die TCSR basic cycle temposcs.

The change amount of the on-die TCSR basic cycle temposc changed by temperature is shown to be larger than that of the EMRS TCSR basic cycle sloscvbp. Specifically, the change amount of the on-die TCSR basic cycle temposc is shown to be remarkably large at low temperature.

Figure 2B:
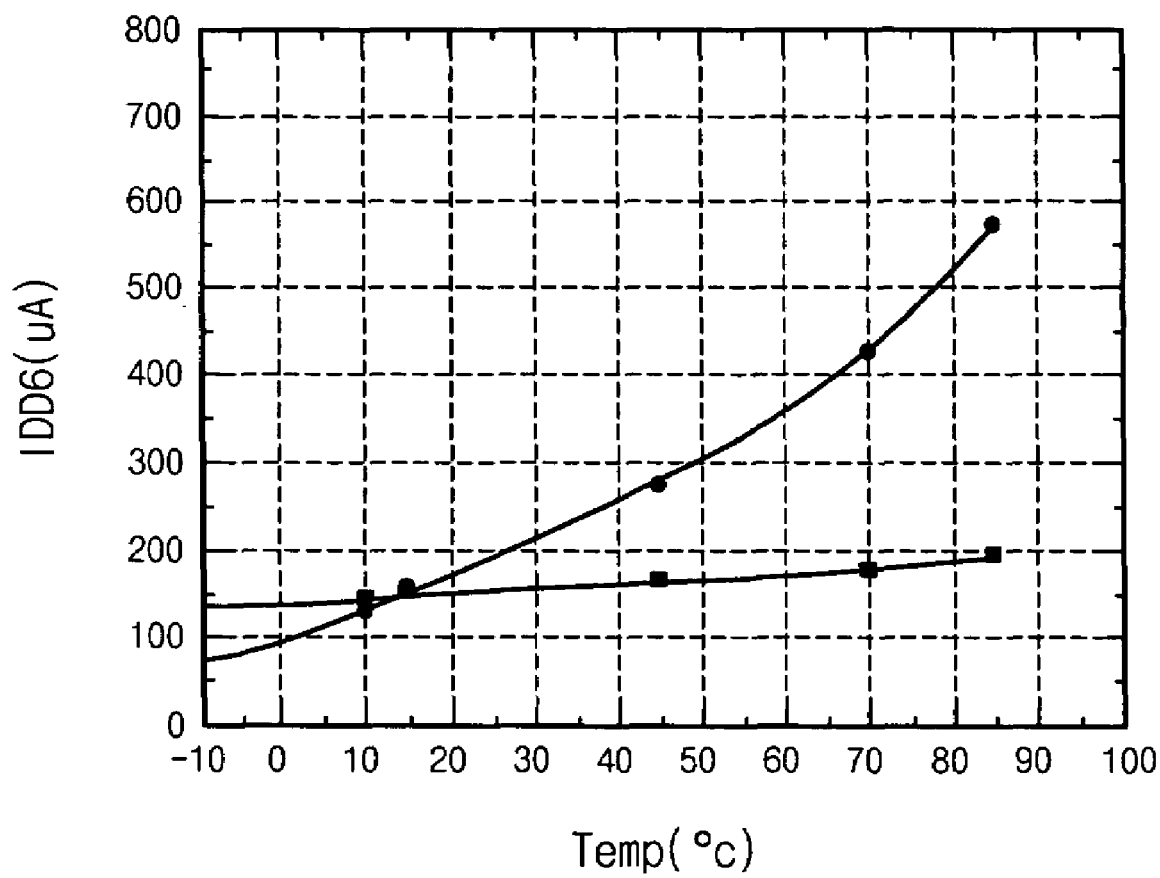
FIG. 2B is a graph illustrating characteristics of current IDD6 at a self-refresh mode when the EMRS TCSR and the on-die TCSR are used.

FIG. 2B is a graph illustrating characteristics of current IDD6 at a self-refresh mode when the EMRS TCSR and the on-die TCSR are used. Here, quaternary division is exemplified.

The current IDD6 more decreases in the on-die TCSR than in the EMRS TCSR at extreme low temperature, thereby generating bit fail. In order to prevent the bit fail, the EMRS TCSR basic cycle sloscvbp is used as a limiter at low temperature.

Table 1 is an example illustrating division values of the EMRS code when the selecting signal temp_on is disabled. Referring to Table 1, the division is reduced as the temperature becomes higher. Here, the default is 4 at TCSR85, 8 at TCSR70, 28 at TCSR45 and 40 at TCSR15.

TABLE 1

|  | srfuse 1 | srfuse 2 | division | psrf(us) | tREC(ms) |
|---|---|---|---|---|---|
| TCSR85 | — | — | 4 | 16 | 64 |
|  | — | x | 5 | 20 | 79 |
|  | x | — | 6 | 24 | 95 |
|  | x | x | 7 | 28 | 110 |
| TCSR70 | — | — | 6 | 26 | 104 |
|  | — | x | 8 | 36 | 142 |
|  | x | — | 10 | 44 | 174 |
|  | x | x | 12 | 52 | 209 |
| TCSR45 | — | — | 24 | 129 | 515 |
|  | — | x | 28 | 152 | 608 |
|  | x | — | 32 | 172 | 686 |
|  | x | x | 36 | 193 | 772 |
| TCSR15 | — | — | 24 | 181 | 725 |
|  | — | x | 32 | 242 | 966 |
|  | x | — | 49 | 306 | 1224 |
|  | x | x | 48 | 363 | 1450 |

Meanwhile, when the selecting signal temp_on is enabled, the division setting unit 6 selects a division value multiplied by the EMRS TCSR basic cycle sloscvbp in response to the detecting signal tempdet detected by the temperature sensor 4. As a result, the cycle of the self-refresh operating cycle psrf can be more stably generated depending on temperature.

Additionally, the division value of the EMRS code is used at low temperature so that the limiter used in the on-die TCSR is not required.

Figure 3:
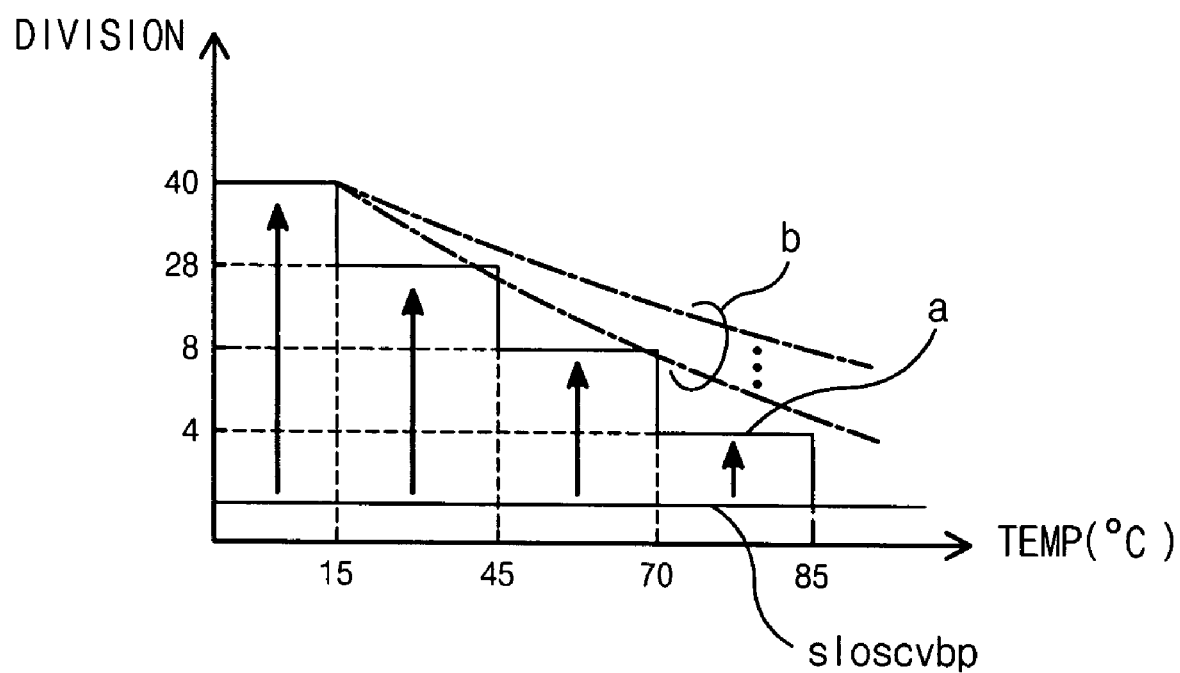
FIG. 3 is a graph illustrating (a) division of the EMRS code and (b) division of the temperature sensor multiplied by the basic cycle of the EMRS TCSR of FIG. 1.

FIG. 3 is a graph illustrating division 'a' of the EMRS code and division 'b' of the temperature sensor multiplied by the basic cycle of the EMRS TCSR of FIG. 1.

Here, the division 'a' of the EMRS code uses the default of Table 1.

The division 'b' by the temperature sensor 4 decreases division linearly as temperature increases. Here, the decrease speed (i.e. gradient) can be regulated through trimming.

The division by the temperature sensor 4 is set to use the division of the EMRS code at low temperature.

As discussed earlier, a self-refresh control circuit according to an embodiment of the present invention can be simplified because multiplying the division of a temperature sensor not by an on-die TCSR basic cycle but by an EMRS TCSR basic cycle sets a self-refresh operating cycle.

In addition, since the division of the EMRS code is used as a limiter at low temperature without a cycle limiter, the circuit can be simplified.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A self-refresh control circuit, comprising:
an EMRS TCSR basic cycle generating unit for generating an EMRS TCSR basic cycle depending on a division value of an EMRS code;
a temperature sensor for generating a detecting signal depending on temperature monitored in a chip;
a division setting unit for generating a reference cycle by multiplying the EMRS TCSR basic cycle by a division value of the EMRS code selected in response to a selecting signal or by a division value corresponding to the detecting signal; and
a self-refresh operating cycle generating unit for generating a self-refresh operating cycle with the reference cycle.

2. The self-refresh control circuit according to claim 1, wherein the selecting signal is to select a basic cycle of an EMRS or on-die TCSR division generator.

3. The self-refresh control circuit according to claim 1, wherein the division setting unit multiplies a division value of the EMRS code by the EMRS TCSR basic cycle when the selecting signal is disabled, and multiplies a division value corresponding to a signal detected by the temperature sensor by the EMRS TCSR basic cycle when the selecting signal is enabled.

4. The self-refresh control circuit according to claim 3, wherein the speed to decrease a division value corresponding to the signal outputted from the temperature sensor is regulated through trimming.

5. The self-refresh control circuit according to claim 3, wherein the division value corresponding to the signal outputted from the temperature sensor is identical with the division value of the EMRS code at less than a predetermined temperature.

* * * * *